(12) United States Patent
Figueroa et al.

(10) Patent No.: US 6,811,410 B2
(45) Date of Patent: Nov. 2, 2004

(54) INTEGRATED CIRCUIT SOCKET WITH CAPACITORS AND SHUNTS

(75) Inventors: David G. Figueroa, Mesa, AZ (US); Yuan-Liang Li, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/156,909

(22) Filed: May 28, 2002

(65) Prior Publication Data

US 2003/0224629 A1 Dec. 4, 2003

(51) Int. Cl.[7] .............................................. H01R 12/00
(52) U.S. Cl. ........................ 439/68; 439/70; 439/620; 439/525; 439/264; 439/330
(58) Field of Search .................. 439/68–71, 620, 439/525–526, 264, 330, 733.1

(56) References Cited

U.S. PATENT DOCUMENTS

| | | | |
|---|---|---|---|
| 4,356,532 A | * 10/1982 | Donaher et al. | 361/734 |
| 5,527,189 A | 6/1996 | Middlehurst et al. | |
| 5,779,502 A | 7/1998 | Daftari et al. | |
| 6,558,169 B2 | * 5/2003 | Figueroa et al. | 439/70 |

OTHER PUBLICATIONS

Mahajan, Ravi; Brown, Ken; Atluri, Vasu (Assembly Technology Development, Intel, Corp.) "The Evolutuion of Microprocessor Packaging" Intel Technology Journal, Q3 2000, pp. 1–10.

* cited by examiner

Primary Examiner—Truc Nguyen
(74) Attorney, Agent, or Firm—Blakely, Sokoloff, Taylor & Zafman LLP

(57) ABSTRACT

An integrated circuit socket with capacitors and shunts is disclosed. According to one embodiment of the invention, a socket is divided into a shunt area, a socket pin area, and a land side capacitor area. The shunt area may contain a variable number of power shunts, ground shunts, and capacitors. The capacitors are connected across, and serve to decouple, power shunts and ground shunts. The shunts are to supply an electrical current from the capacitors to an integrated circuit device. The socket pin area may be surrounded by a metal fence serving as to lessen electromagnetic interference and as a ground and/or signal reference. The fence may be divided into sub-areas each comprising a coaxial differential signal pin opening pair. In alternate designs, an elongated power bar may serve as a power or ground shunt and may be used with several capacitors.

6 Claims, 4 Drawing Sheets

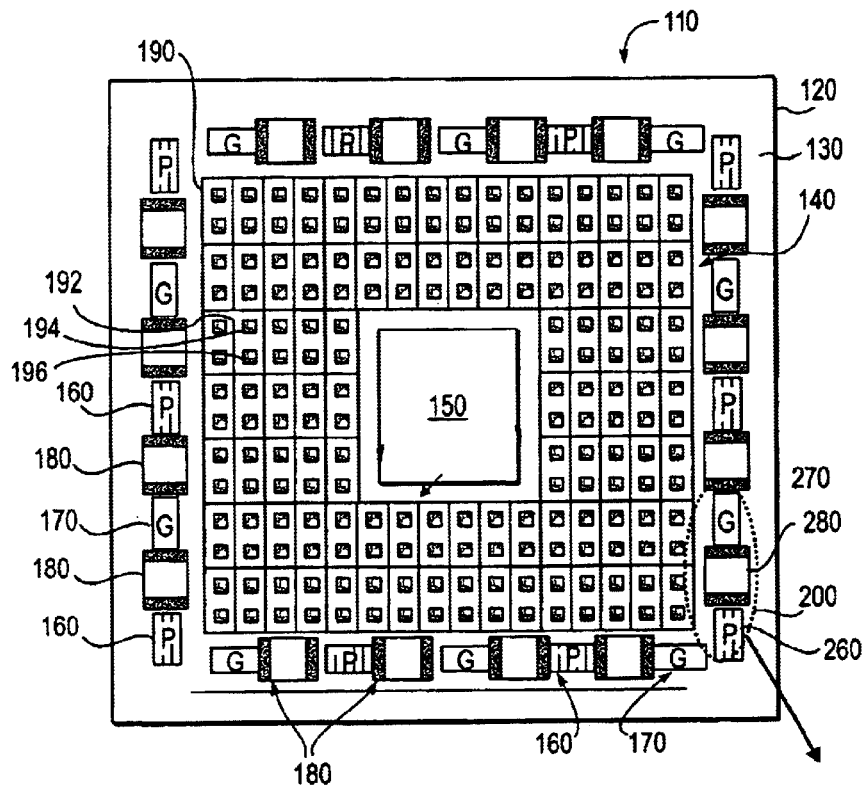
FIG. 1
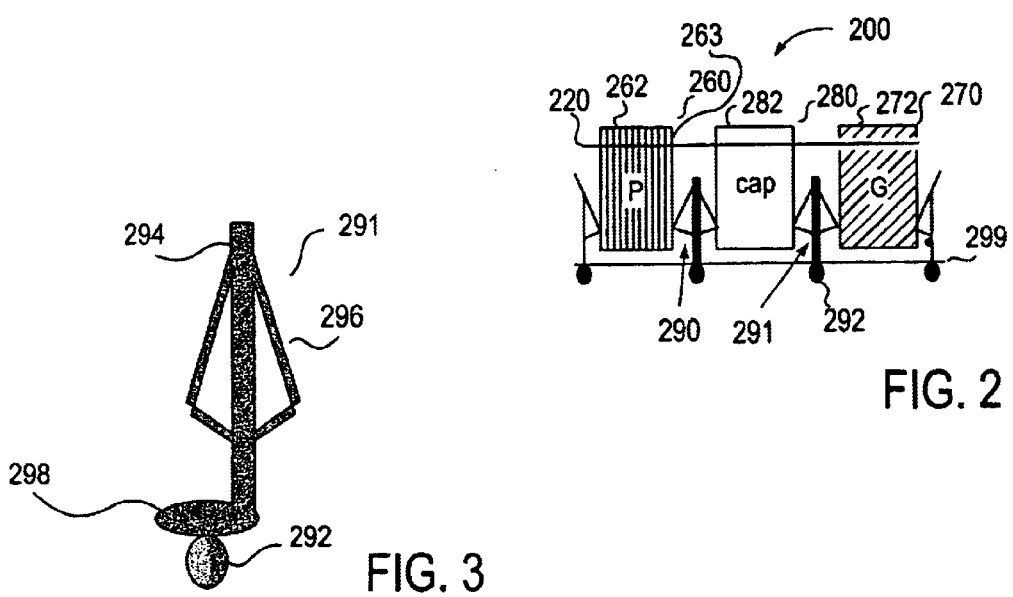
FIG. 2
FIG. 3

INTEGRATED CIRCUIT SOCKET WITH CAPACITORS AND SHUNTS

BACKGROUND

1. Field

Embodiments of the invention relate to the field of integrated circuit packaging. More specifically, the invention relates to a power delivery system for an integrated circuit.

2. Background

Integrated circuit package substrates are often attached to printed circuit boards via sockets. Generally, a socket may convey power, ground, and information signals between the leads of a package substrate and connections on a printed circuit board. For example, a package substrate may be inserted on a socket that is attached to a motherboard or a personal computer.

Typically, an electrical current is delivered from the power supply on a power plane to an integrated circuit device (e.g., a microprocessor chip) through the package substrate. However, high clock speed circuits and power conservation design techniques result in fast, unpredictable, and large magnitude changes in the supply current. The rate of change of many amps per nanosecond of this switching current far exceeds the ability of the power supply and the voltage regulator to respond. If not managed, these current transients manifest themselves as power supply noise that ultimately limits how fast the circuits can operate.

BRIEF DESCRIPTION OF THE DRAWINGS

The invention may best be understood by referring to the following description and accompanying drawings that are used to illustrate embodiments of the invention. In the drawings:

FIG. 1 is a plan view of a socket according to one embodiment of the invention.

FIG. 2 is a partial side view cutaway of region 200 in FIG. 1.

FIG. 3 is an enlarged view of a contact shown in FIG. 2.

DETAILED DESCRIPTION

Figure 4:
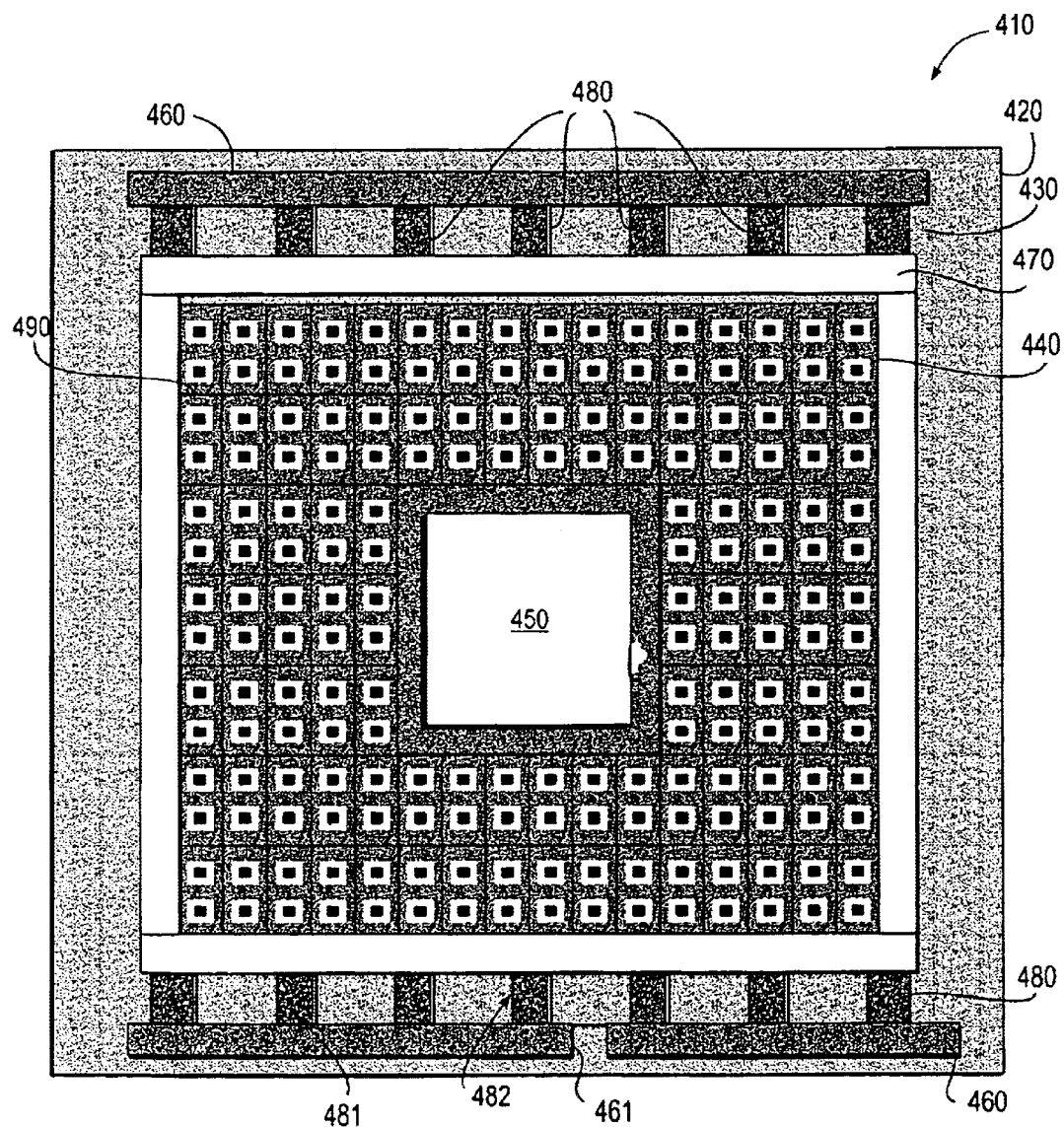
FIG. 4 is a plan view of a socket according to another embodiment of the invention.

In the following description, numerous specific details are set forth. However, it is understood that embodiments of the invention may be practiced without these specific details. In other instances, well-known circuits, structures and techniques have not been shown in detail in order not to obscure the understanding of this description.

A socket comprising a shunt delivering an electric current from a capacitor on the socket to an integrated circuit device is described. According to one embodiment of the invention, a socket is on a printed circuit board, which transfers power, ground, and signal (I/Os) to the integrated circuit device on an integrated circuit package substrate. The socket arrangement for an integrated circuit device (e.g., a processor) may employ a socket having a plan area that is divided into at least a socket pin area and a shunt area to supply the electric current from the capacitor to the integrated circuit device, as will be described.

FIG. 1 illustrates a socket comprising capacitors and shunts according to one embodiment of the invention. FIG. 1 shows socket 110 having socket body 120. Socket body 120 is divided into three areas: shunt area 130; socket pin area 140; and land side capacitor area 150. Shunt area 130 includes spaces for power shunts 160 and ground shunts 170. In addition, the shunt area 130 includes capacitors 180 (or may include contact elements capable of receiving capacitors, as will be described below).

The shunt area 130 is arranged to deliver power to an integrated circuit device when the integrated circuit device is attached to the socket. Such capacitors 180 may be any combination of low, high, and/or mid-frequency capacitors and may decouple power shunts 160 and ground shunts 170. For example, region 200 of shunt area 130 includes power shunt 260, ground shunt 270, and capacitor 280. The power shunt 260 to provide power from the capacitor 280 to the integrated circuit device. In this way, the decoupling capacitance of the capacitor 280 serves as a reservoir that provides part of the electrical current power required when buffers switch. This reduces the AC (alternating-current) voltage drop, also called the switching noise or the ground bounce, of the power/ground path from the power plane to the integrated circuit device. In this way, the power shunt 260 and ground shunt 270 may also provide power from a printed circuit board (not shown here) to the integrated circuit device.

Any of the capacitors 180 may be removably attached, so that socket 110 may be used in different arrangements for different applications. Thus, the same socket could be used in different arrangements having different amounts of capacitance. In FIG. 1, socket 110 is shown in an arrangement having sixteen capacitors 180, ten power shunts 160, and ten ground shunts 170.

It should be understood that any of the capacitors may be removed from socket 110 to form a different arrangement than that shown in FIG. 1, for cost savings or performance enhancement, at the expense of imperviousness to noise or of robustness. The desired cost and/or performance may be evaluated versus the expected amount of electrical noise, and selecting a certain number of capacitors 180 to employ in a given application of socket 110 based on such factors, and could be repeated with the same socket 110 for use in other applications having different cost, performance, and decoupling requirements. As such, the number of capacitors added to socket 110 could vary from application to application. For example, in an arrangement expected to experience a larger amount of electrical noise, more capacitors could be attached to the socket. In an arrangement designed to minimize cost or increase performance, fewer capacitors might be used. In addition, in this way, current may be supplied quickly to the integrated circuit device during a voltage drop.

Socket pin area 140 contains socket pin openings to receive one or more pins from the package substrate. The socket pin area 140 comprises socket pin openings arranged in pairs, to receive differential socket pin pairs of an integrated circuit device or package substrate. This way, the socket pin area 140 may be free of power supplies and the heat associated therewith. In alterative embodiments, other signal pin configurations may be used (e.g., single ended pins) that are well known to those of ordinary skill in the art.

FIG. 1 also illustrates socket pin area 140 being surrounded by metal fence 190. Metal fence 190 may serve as a ground and/or a signal reference, and may also shield socket pin area 140 from electromagnetic interference (e.g., similar to the outer conductor of a coaxial cable). Metal fence 190 may be in the form of a grid as shown in FIG. 1. This grid design allows for the metal fence 190 to individually surround sub-areas of socket pin area 140. For example, each sub-area may be an individual pair of openings for differential signaling pins. Sub-area 192 is shown having a pair of pin openings 194 and 196. Thus, sub-area 192 of metal fence 190 surrounds pin openings 194 and 196, helping to shield pin openings 194 and 196 from cross-talk with other pin openings pairs. In one embodiment, the sub-area 192 may accommodate a coaxial differential signal pin pair.

Land side capacitor area 150 provides space for optional land side capacitors. In an alternate design, land side capacitor area 150 may be omitted, in which case the area may become part of socket pin area 140.

FIG. 2 is a partial cut-away side view in FIG. 1. Power shunt 260, ground shunt 270, and capacitor 280 are shown protruding above the top surface 220 of region 200. Contact elements 290 and 291 receive capacitor 280. Capacitor 280 may be removably attached to socket 110 by press-fit with contact elements 290 and 291. In this embodiment, the capacitor 280 is in electrical communication with power shunt 260 through contact element 290, and with ground shunt 270 through contact element 291. Thus, capacitor 280 is connected across power shunt 260 and ground shunt 270, thereby decoupling power shunt 260 and ground shunt 270.

Contact element 291 is attached to surface 299, thereby connecting the socket to a voltage regulator and/or power supply, thereby providing the storage of a charge by the capacitor. The surface 299 may be an upper surface of a printed circuit board, such as the motherboard of a personal computer, in which case contact element 291 may be inserted through the printed circuit board and secured with solder ball 292. In an alternative embodiment, surface 299 may be a metal plate that is attached to a printed circuit board, in which case contact element 291 may be stamped directly from the metal plate and formed in one piece with the metal plate. In either example, contact element 290 may be electrically isolated from contact element 291, except for communication through capacitor 280.

Power shunt 260 has a side 263 in contact with contact element 290. Side 263 of power shunt 260 is capable of communicating with a printed circuit board through contact element 290. In this way, the power shunt 260 may carry an electrical current from either the capacitor 280 or the power supply.

Top surface 262 of power shunt 260, top surface 272 of ground shunt 270, and top surface 282 of capacitor 280 may contact an integrated circuit package substrate (not shown). For example, top surfaces 262, 272, and 282 may be soldered to the package substrate. In one embodiment, power shunts 160, ground shunts 170 might be soldered to an integrated circuit package substrate before the package substrate is plugged into socket 110.

FIG. 3 is an enlarged view of contact element 291. Contact element 291 has arms 296 and pin 294. Arms 296 are adapted to receive, and to contact a side of, a power shunt, a ground shunt, and/or a capacitor. Pin 294 may be formed in one piece with fin 298, which may be part of or attached to surface 299. Solder ball 292 can be used to attach contact element 291 to a printed circuit board, as described.

FIG. 4 shows an arrangement for a socket of an alternate design. Socket 410 has socket body 420. Socket body 420 is divided into three areas: shunt area 430, socket pin area 440; and land side capacitor area 450. Shunt area 430 includes power shunts 460 and capacitors 480. Shunt area 430 is divided from socket pin area 440 by grounding element 470. Power shunts 460 are decoupled from grounding element 470 by capacitors 480. For example, capacitors 481 and 482 are connected across grounding element 470 and power shunt 461. The number of capacitors that are used to decouple power shunt 461 and grounding element 470 may be adjusted for conditions and performance requirements. Therefore, in one embodiment, capacitors 480 are removable, permitting the arrangement of FIG. 4 to be adjusted for different applications.

Grounding element 470 is connected to, or formed as part of, grounded metal fence 490 As shown, grounding element 470 is part of grounded metal fence 490. Thus, capacitors 481 and 482 may be connected between power shunt 461 and metal fence 490. In this way, the metal fence 490 may lessen (or eliminate) the electromagnetic interference (EMI) to the signal pins caused by the capacitor 480 in the shunt area 430.

Grounded metal fence 490 may also separate and shield socket pin openings from each other. As shown, grounded metal fence 490 surrounds pairs of socket pin openings and shields them from cross-talk with the other socket pin openings. These pairs of socket pin openings may be adapted to receive pairs of differential signal pins (not shown) from an integrated circuit package substrate.

Socket 410 offers lower resistance than socket 110 because power shunts 460 of socket 410 are formed as wide elongated power bars compared to power shunts 160 of socket 110, and the grounding element 470 includes thicker metal that is used for ground.

Figure 5A:
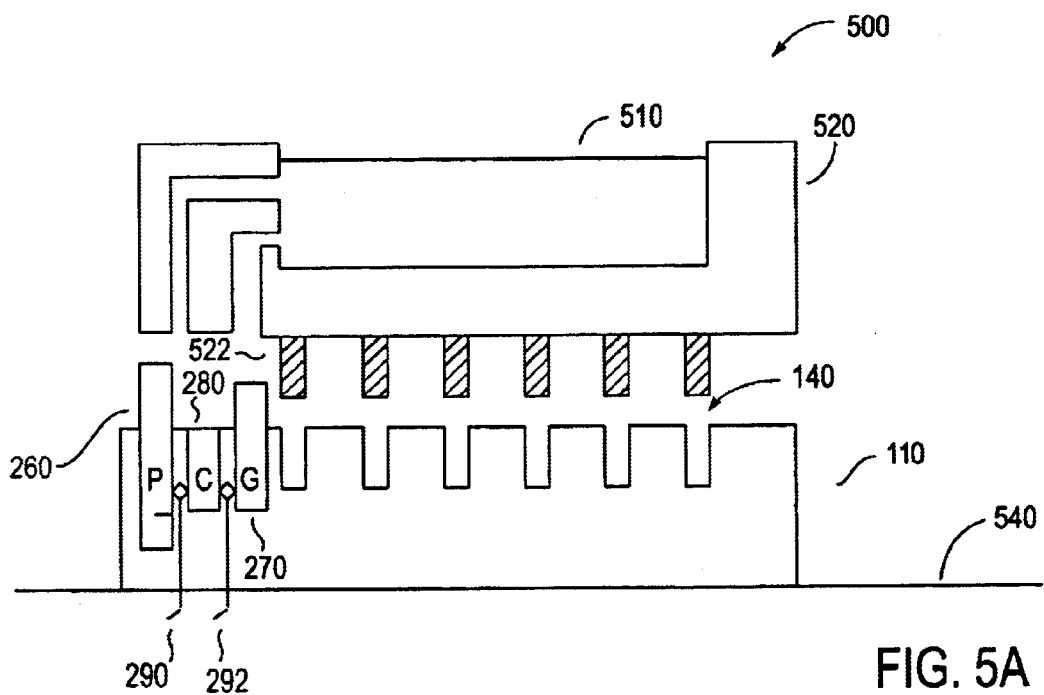
FIGS. 5A and 5B illustrate cross-sectional side views of a semiconductor assembly according to either the embodiments of FIG. 1 or FIG. 4.
Figure 5B:
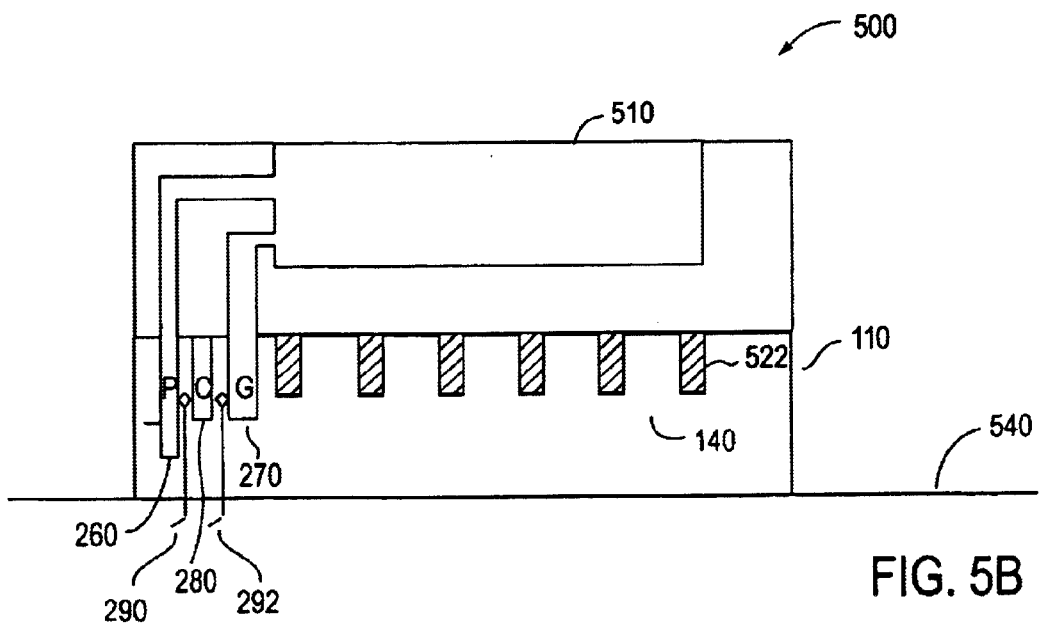

FIGS. 5A and 5B illustrate a connected and a disconnected cross-sectional view, respectively, of a semiconductor assembly 500 according to one embodiment of the invention. The semiconductor assembly 500 is on a printed circuit board (e.g., motherboard) 540. The semiconductor assembly 500 includes an integrated circuit die 510, a package substrate 520, a set of package substrate pins 522, the socket 110, the capacitor 280, the power shunt 260, the ground shunt 270, and contact elements 290 and 292.

The integrated circuit die 510 (e.g., processor chip) is on the package substrate 520. In addition to providing a protective mechanical enclosure, the package substrate 520 may also include thermal and electrical management components that are well known to those of ordinary skill in the art. The set of package substrate pins 522 are on the package substrate 520 to be received by the openings on the socket pin area 140. The capacitor 280, power shunt 260, and ground shunt 260 are on the socket 110. As shown in FIG. 5B, when connected, the power shunt 260 provides a circuit from the capacitor 280 through the package substrate 520 to the integrated circuit die 510. The capacitor 280 may store an electric charge from a power plane connecting the capacitor to a power supply (not shown) on the printed circuit board 540 via the contact elements 290 and 292. It should be understood that the shunt may also be a side contact shunt that provides a circuit from the capacitor 280 exiting from a side of the socket 110 rather than the top of the surface 220, and entering from a side of the package substrate 520 through to the integrated circuit 510. In these ways, the power shunt 260 may deliver an electric current from the capacitor 280 to the integrated circuit die 510.

Figure 6:
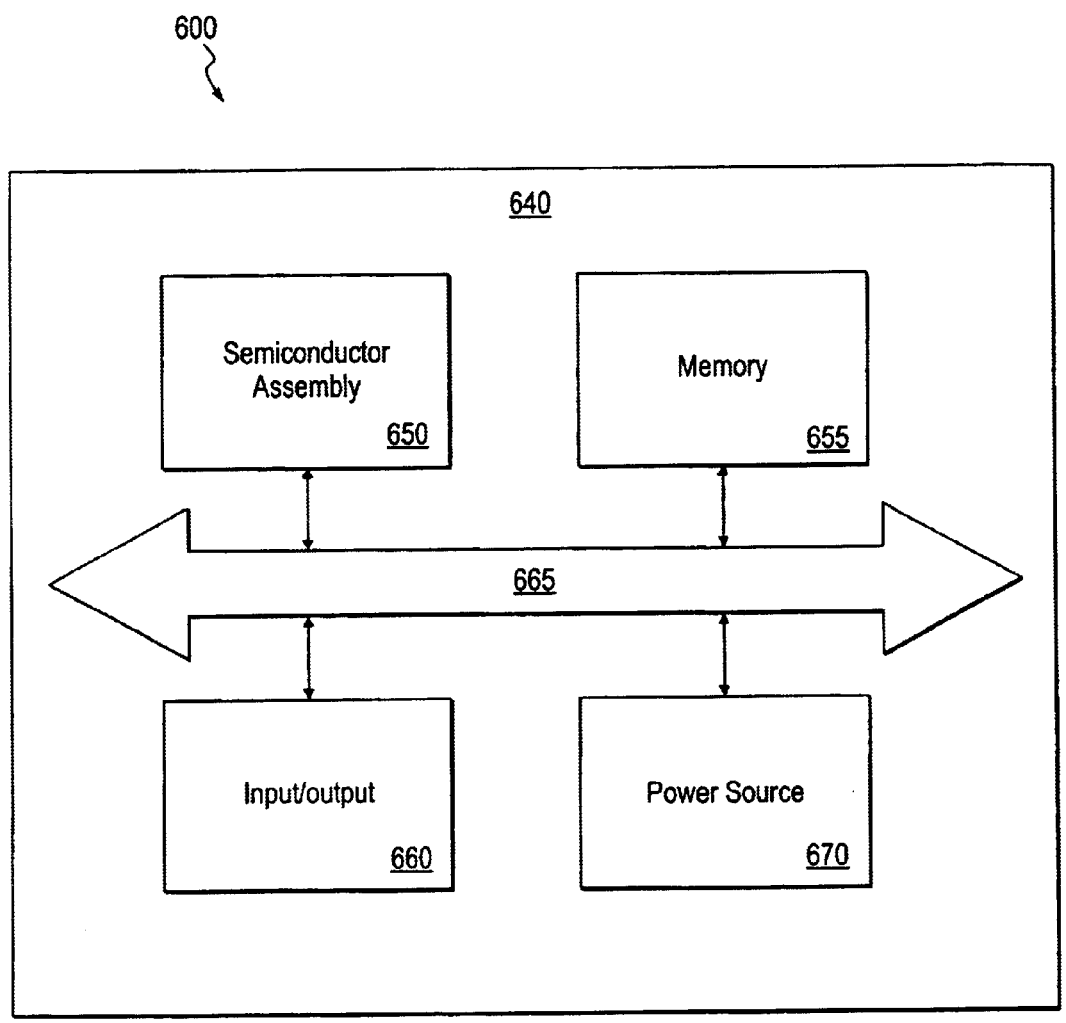
FIG. 6 illustrates a computer system in which the present invention may be implemented.

FIG. 6 illustrates a computer system 600 that includes one or more integrated circuit sockets with capacitors and shunts, in accordance with various embodiments of the present invention. The computer system 600 may be part of a general-purpose or special-purpose computer system that is on a printed circuit board 640 and includes a semiconductor assembly 650, a memory 655, an input/output capability 660, and a power source 670 coupled to a system bus 665, as shown. The semiconductor assembly 650 may include a die, a package substrate, a set of package substrate pins, and a socket with one or more capacitors and shunts, in accordance with various embodiments of the invention as described. The power source 670 provides an electric charge to the capacitors on the socket that is used to provide an electric current to the die via a shunt, as described. However, it should be understood that the invention is not limited to the computer system 600 as disclosed in FIG. 6 and alternative embodiments of computer system architectures that are well known to those of ordinary skill in the art may also be used within the scope of the detailed description of embodiments of the invention.

The above-described arrangements may permit over ninety percent of the socket's total current to flow through the shunt area. This moves some high direct current (DC) away from the signal pins. Moving current away from the socket pin area also moves the heat created by that current away from the signal paths. Removing heat from the socket pin area increases the reliability of signal transfer through the socket pins. It also increases the heat budget of the signal pins, permitting larger signal currents associated with faster input/output through the socket pins.

It should be understood that although the socket area on the socket has been described as having pin openings to receive one or more package substrate pins, in alternative embodiments the socket pin area may contain socket pins for transmittal of information signals and the integrated circuit package substrate includes the pin openings to receive the pins. Here, the socket pin area may contain socket pins arranged in differential pin pairs. A metal fence may also be formed around the socket pin area when the package substrate is connected and may also divide the socket pin pairs from each other given the grid design as described above. Again, the metal fence may serve as a ground or reference for signals transmitted through the socket pins. Therefore, the shunt area may be entirely outside of the metal fence.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A socket comprising:
   a plurality of socket pin openings, in a socket pin area, to receive a plurality of socket pins on a package substrate having an integrated circuit device;
   a capacitor on the socket in a shunt area, the capacitor to store an electric charge from a power source via a printed circuit board when the socket is connected to the printed circuit board; and
   a power shunt to provide a circuit from the capacitor directly to the integrated circuit device connected to the socket, the circuit to carry an electric current from the capacitor to the integrated circuit device.

2. The socket of claim 1 wherein the capacitor is a mid-frequency capacitor.

3. The socket of claim 1 wherein the integrated circuit device is a processor.

4. The socket of claim 1 further comprising a metal fence formed around the socket pin area, thereby separating the capacitor in the shunt area from the plurality of socket pin openings in the socket pin area.

5. The socket of claim 1 wherein the plurality of pin openings being divided into pairs to receive differential pin pairs on the package substrate.

6. The socket of claim 5 wherein each pair of pin openings to be surrounded by a metal fence.

* * * * *